United States Patent
Camacho et al.

(10) Patent No.: US 8,203,201 B2
(45) Date of Patent: Jun. 19, 2012

(54) INTEGRATED CIRCUIT PACKAGING SYSTEM WITH LEADS AND METHOD OF MANUFACTURE THEREOF

(75) Inventors: Zigmund Ramirez Camacho, Singapore (SG); Emmanuel Espiritu, Singapore (SG); Henry Descalzo Bathan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 158 days.

(21) Appl. No.: 12/732,465

(22) Filed: Mar. 26, 2010

(65) Prior Publication Data

US 2011/0233753 A1    Sep. 29, 2011

(51) Int. Cl.
*H01L 23/495* (2006.01)

(52) U.S. Cl. ............. 257/676; 257/E23.141; 257/673; 257/690; 257/692; 438/106; 438/121; 438/123

(58) Field of Classification Search ............. 257/E23.06, 257/E23.141, E21.504, E21.509, 676, 673, 257/690, 692, 784, 797, 343, 165; 438/123–126, 438/106, 108, 113, 114, 401, 426
See application file for complete search history.

(56) References Cited

U.S. PATENT DOCUMENTS

| | | | |
|---|---|---|---|
| 5,656,550 A | 8/1997 | Tsuji et al. | |
| 5,804,468 A | 9/1998 | Tsuji et al. | |
| 5,847,458 A * | 12/1998 | Nakamura et al. | 257/738 |
| 6,232,561 B1 | 5/2001 | Schmidt et al. | |
| 6,313,519 B1 | 11/2001 | Gainey et al. | |
| 6,348,726 B1 * | 2/2002 | Bayan et al. | 257/666 |
| 6,358,778 B1 * | 3/2002 | Shinohara | 438/123 |
| 6,818,973 B1 | 11/2004 | Foster | |
| 6,908,843 B2 | 6/2005 | Baldonado et al. | |
| 6,927,096 B2 * | 8/2005 | Shimanuki | 438/113 |
| 6,927,483 B1 * | 8/2005 | Lee et al. | 257/676 |
| 6,946,324 B1 | 9/2005 | McLellan et al. | |
| 6,989,294 B1 * | 1/2006 | McLellan et al. | 438/111 |
| 6,995,459 B2 * | 2/2006 | Lee et al. | 257/676 |
| 6,995,460 B1 | 2/2006 | McLellan et al. | |
| 7,019,389 B2 | 3/2006 | Lai et al. | |
| 7,049,177 B1 | 5/2006 | Fan et al. | |
| 7,060,535 B1 * | 6/2006 | Sirinorakul et al. | 438/123 |
| 7,081,403 B1 | 7/2006 | Kirloskar et al. | |
| 7,095,100 B2 | 8/2006 | Kasuya | |
| 7,144,517 B1 * | 12/2006 | Yang et al. | 216/13 |
| 7,226,811 B1 * | 6/2007 | McLellan et al. | 438/111 |
| 7,247,526 B1 * | 7/2007 | Fan et al. | 438/123 |
| 7,271,032 B1 | 9/2007 | McLellan et al. | |
| 7,285,444 B2 | 10/2007 | Danno | |

(Continued)

OTHER PUBLICATIONS

U.S. Appl. No. 12/329,467, filed Dec. 5, 2008, Camacho.

(Continued)

*Primary Examiner* — Chris Chu
(74) *Attorney, Agent, or Firm* — Ishimaru & Associates LLP; Mikio Ishimaru; Stanley Chang (57) ABSTRACT

A method of manufacture of an integrated circuit packaging system includes: forming a paddle, an inner post adjacent to the paddle, a jumper pad, and an outer post, with the jumper pad between the inner post and the outer post; mounting an integrated circuit over a paddle first side, the paddle first side co-planar with the outer post; connecting a first jumper interconnect between the integrated circuit and the jumper pad; connecting a second jumper interconnect between the jumper pad and the outer post; and forming an encapsulation over paddle, the integrated circuit, the first jumper interconnect, the jumper pad, and the second jumper interconnect.

17 Claims, 3 Drawing Sheets

U.S. PATENT DOCUMENTS

| | | | |
|---|---|---|---|
| 7,323,765 B2 | 1/2008 | Lam | |
| 7,335,529 B2 * | 2/2008 | Miyaki et al. | 438/106 |
| 7,459,347 B2 * | 12/2008 | Shimanuki et al. | 438/123 |
| 7,556,987 B2 | 7/2009 | Dimaano et al. | |
| 7,683,461 B2 * | 3/2010 | Lau | 257/666 |
| 7,732,901 B2 * | 6/2010 | Camacho et al. | 257/676 |
| 7,790,500 B2 * | 9/2010 | Ramos et al. | 438/106 |
| 7,807,498 B2 * | 10/2010 | Shoji et al. | 438/106 |
| 7,816,186 B2 * | 10/2010 | San Antonio et al. | 438/123 |
| 7,858,443 B2 * | 12/2010 | Powell et al. | 438/111 |
| 7,915,716 B2 * | 3/2011 | Pisigan et al. | 257/666 |
| 2001/0008305 A1 * | 7/2001 | McLellan et al. | 257/692 |
| 2001/0035569 A1 | 11/2001 | Shibata | |
| 2004/0070056 A1 | 4/2004 | Matsuzawa et al. | |
| 2007/0235854 A1 | 10/2007 | Camacho et al. | |
| 2009/0115040 A1 * | 5/2009 | Camacho et al. | 257/677 |
| 2009/0283882 A1 * | 11/2009 | Hsieh et al. | 257/676 |
| 2010/0006992 A1 | 1/2010 | Dirks | |
| 2010/0044843 A1 * | 2/2010 | Chang Chien et al. | 257/676 |
| 2010/0044850 A1 * | 2/2010 | Lin et al. | 257/690 |
| 2011/0163430 A1 * | 7/2011 | Lee et al. | 257/676 |
| 2011/0201159 A1 * | 8/2011 | Mori et al. | 438/123 |

OTHER PUBLICATIONS

U.S. Appl. No. 12/732,423, filed Mar. 26, 2010, Camacho et al.

\* cited by examiner

INTEGRATED CIRCUIT PACKAGING SYSTEM WITH LEADS AND METHOD OF MANUFACTURE THEREOF

CROSS-REFERENCE TO RELATED APPLICATION(S)

The present application contains subject matter related to concurrently filed U.S. patent application Ser. No. 12/732,423, filed Mar. 26, 2010. The related application is assigned to STATS ChipPAC Ltd. The subject matter thereof is incorporated herein by reference thereto.

TECHNICAL FIELD

The present invention relates generally to an integrated circuit packaging system, and more particularly to a system for an integrated circuit packaging system with posts.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package-on-package (POP). POP designs face reliability challenges and higher cost.

Thus, a need still remains for a circuit system improved yield, low profile, and improved reliability. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a paddle, an inner post adjacent to the paddle, a jumper pad, and an outer post, with the jumper pad between the inner post and the outer post; mounting an integrated circuit over a paddle first side, the paddle first side co-planar with the outer post; connecting a first jumper interconnect between the integrated circuit and the jumper pad; connecting a second jumper interconnect between the jumper pad and the outer post; and forming an encapsulation over paddle, the integrated circuit, the first jumper interconnect, the jumper pad, and the second jumper interconnect.

The present invention provides an integrated circuit packaging system, including: a paddle having a paddle first side and the paddle second side; an integrated circuit mounted over the paddle first side; an inner post adjacent to the paddle; a jumper pad adjacent to the inner post on a side opposite the paddle; an outer post adjacent to the jumper pad, with the jumper pad between the inner post and the outer post; a first jumper interconnect connected between the integrated circuit and the jumper pad; a second jumper interconnect connected between the jumper pad and the outer post; and an encapsulation over the paddle, the integrated circuit, the jumper pad, and the outer post.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" is defined as meaning there is direct contact between elements or components with no intervening material.

The term "processing" as used herein includes deposition of material or photoresist, patterning, exposure, development, etching, cleaning, and/or removal of the material or photoresist as required in forming a described structure.

Figure 1:
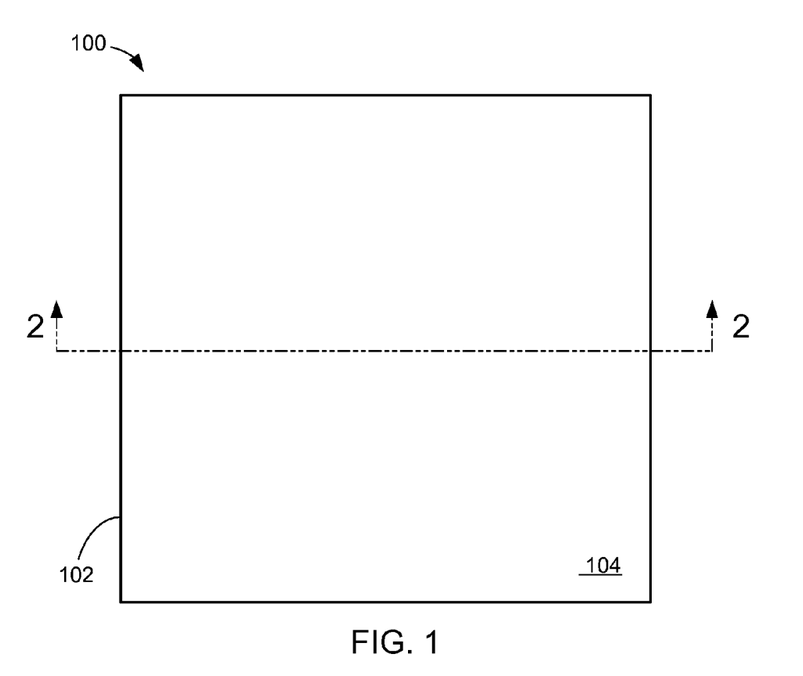
FIG. 1 is a top view of an integrated circuit packaging system in a first embodiment of the present invention.

Referring now to FIG. 1, therein is shown a top view of an integrated circuit packaging system 100 in a first embodiment of the present invention. The top view depicts an encapsulation 102, such as a cover including an epoxy molding compound. The encapsulation can have an encapsulation first side 104.

For illustrative purposes, the integrated circuit package system 100 is shown with the encapsulation 102 having a square geometric configuration, although it is understood that the encapsulation 102 can have a different geometric configuration. For example, the integrated circuit package system 100 can have the encapsulation 102 with a rectangular geometric configuration.

Figure 2:
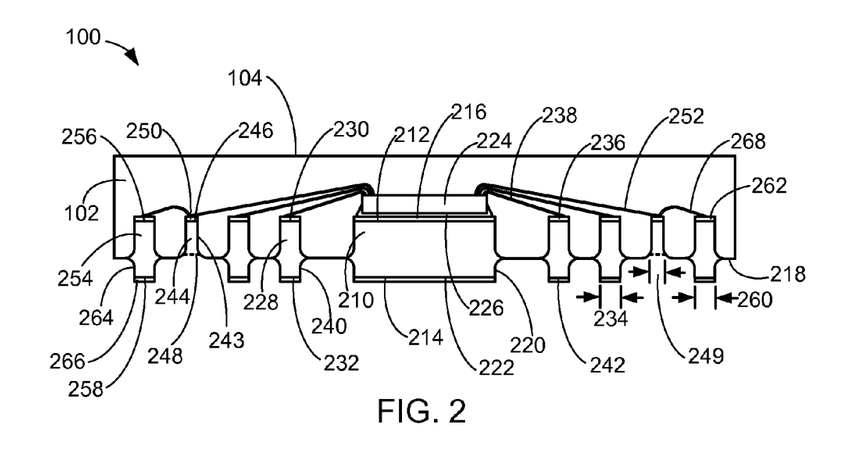
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The cross-sectional view depicts a paddle 210, more specifically a die-attached paddle. The paddle 210 can have a paddle first side 212 and a paddle second side 214. The paddle first side 212 is entirely planar.

A contact layer 216, such as a coating or plating made out of materials including gold, silver, nickel-palladium alloy, or other alloys, can be over or on the paddle first side 212. The contact layer 216 functions as a wet-enhancing layer, an adhesion layer, or a combination thereof. The paddle 210 can include the contact layer 216.

The paddle 210 can be exposed from an encapsulation second side 218 of the encapsulation 102. The paddle 210 can include a paddle extension 220. The paddle extension 220 can extend from the encapsulation second side 218. The paddle second side 214 can be along the portion of the paddle extension 220 facing away from the encapsulation second side 218.

A paddle barrier 222, such as a coating or plating made from materials including gold, silver, nickel-palladium alloy, other alloys, or a material similar to the material used to form the contact layer 216, can be on the paddle second side 214. The paddle barrier 222 functions as an etch protection layer, an etch stop barrier, an adhesion layer, a wet-enhancing layer, or a combination thereof. The paddle barrier 222 can be optional.

An integrated circuit 224, such as an integrated circuit die or a flip chip, can be mounted over the paddle first side 212.

The integrated circuit 224 can be over the contact layer 216. The integrated circuit 224 can be mounted with an adhesive 226, such as an adhesive paste or an adhesive film, between the integrated circuit 224 and the contact layer 216.

Inner posts 228, more specifically a conductive structure made from copper, a copper alloy, or a conductive alloy, can be adjacent to the paddle 210. The inner posts 228 can have an inner post first side 230 and an inner post second side 232. The inner post first side 230 can be co-planar with the paddle first side 212. The inner posts 228 can have an inner post width 234.

Inner contact pads 236, such as a coating or plating made from materials including gold, silver, nickel-palladium alloy, other alloys, or a material similar to the material used to form the contact layer 216, can be over the inner post first side 230. The inner contact pads 236 functions as a wet-enhancing layer, an adhesion layer, or a combination thereof. The inner post 228 can include the inner contact pads 236.

An inner interconnect 238, more specifically a bond wire or a ribbon bond wire, can connect the integrated circuit 224 and the inner posts 228. The inner interconnect 238 can be connected to the inner contact pads 236.

The inner posts 228 can have an inner post extension 240. The inner post extension 240 can be exposed and extend from the encapsulation second side 218. The inner post second side 232 can be along the portion of the inner post extension 240 facing away from the encapsulation second side 218.

Inner mounting pads 242, more specifically a coating or plating made from materials including gold, silver, nickel-palladium alloy, other alloys, or a material similar to the material used to form the contact layer 216, can be along the inner post second side 232. The inner mounting pads 242 function as an etch protection layer, an etch stop barrier, an adhesion layer, a wet-enhancing layer, or a combination thereof.

For illustrative purposes, the integrated circuit packaging system 100 is shown having two rows of the inner posts 228, although it is understood that the integrated circuit packaging system 100 can have a different number of the inner posts 228. For example, the integrated circuit packaging system 100 can have one of the inner posts 228 or three or more of the inner posts 228.

The encapsulation can have an encapsulation cavity 243 extending inwardly from the encapsulation second side 218. The encapsulation cavity 243 can be adjacent to the inner post 228 on the side opposite from the paddle 210.

Jumper pads 250, more specifically a plate or pad made from materials including gold, silver, nickel-palladium alloy, other alloys, or a material similar to the material used to form the contact layer 216, can be in the encapsulation cavity 243. A portion of the jumper pads 250 can be exposed within the cavity 243. The jumper pads 250 can be co-planar with the paddle first side 212. The jumper pads 250 can have a jumper pad width 249. The jumper pad width 249 can be less than the inner post width 234.

A first jumper interconnect 252, more specifically a bond wire or a ribbon bond wire, can connect between integrated circuit 224 and the jumper contact pads 250. The first jumper interconnect 252 can connect to the portion of the jumper pad 250 facing away from the encapsulation second side 218.

Optionally, jumper posts 244, more specifically a conductive structure made from copper, a copper alloy, or a conductive alloy, can be adjacent to the inner posts 228 on the side opposite from the paddle 210, as shown by the dashed line. The jumper posts 244 can have a jumper post first side 246 and a jumper post second side 248. The jumper post first side 246 can be co-planar with the paddle first side 212. The jumper posts 244 can include the jumper pads 250 on the jumper post first side 246. The jumper post second side 248 can be exposed and recessed from the encapsulation second side 218.

Outer posts 254, such as a conductive structure made from copper, a copper alloy, or a conductive alloy, can be adjacent to the jumper pads 250. The jumper pads 250 can be between the inner posts 228 and the outer posts 254. The outer posts 254 can have an outer post first side 256 and an outer post second side 258. The outer post first 256 can be co-planar with the paddle first side 212.

The outer posts 254 can have an outer post width 260. The outer post width 260 can be similar to the inner post width 234. The jumper post width 249 can be less than the outer post width 260.

Outer contact pads 262, such as a coating or plating made from materials including gold, silver, nickel-palladium alloy, other alloys, or a material similar to the material used to form the contact layer 216, can be over the outer post first side 256. The outer contact pads 262 function as a wet-enhancing layer, an adhesion layer, or a combination thereof. The outer posts 254 can include the outer contact pads 262.

The outer posts 254 can have an outer post extension 264. The outer post extension 264 can be exposed from and extend from the encapsulation second side 218. The outer post second side 258 can be along the portion of the outer post extension 264 facing away from the encapsulation second side 218.

Outer mounting pads 266, such as a coating made of a coating or plating made from materials including gold, silver, nickel-palladium alloy, other alloys, or a material similar to the material used to form the contact layer 216, can be on the outer post second side 258. The outer mounting pads 266 function as an etch protection layer, an etch stop barrier, an adhesion layer, a wet-enhancing layer, or a combination thereof.

A second jumper interconnect 268, more specifically a bond wire or ribbon bond wire, can connect between the jumper pads 250 and the outer posts 254. The second jumper interconnect 268 can be connected between the portion of the jumper pads 250 facing away from the encapsulation second side 218 and the outer contact pads 262.

The encapsulation 102 can be around the paddle 210, the inner posts 228, the jumper pads 250, and the outer posts 254. The encapsulation 102 can cover the integrated circuit 224, the adhesive 226, the inner interconnect 238, the inner contact pads 236, the first jumper interconnect 252, the second jumper interconnect 268, and the outer contact pads 262. The encapsulation first side 104 and the encapsulation second side 218 are horizontal.

It has been discovered that the present invention provides the integrated circuit packaging system 100 having increased connectivity with improved reliability and yield. The jumper pads 250 allow for increased connection count with the integrated circuit 224 while reducing wire lengths and potential wire sweeps resulting in wire separation or inadvertent shorts, respectively thereby improving reliability and yield.

It has also been discovered that the present invention provided the integrated circuit packaging system 100 having improved reliability. The jumper pads 250 within the encapsulation cavity 243 prevents inadvertent shorts of the inner posts 228, the outer posts 254, and the jumper pads 250 when connecting to the next system level (not shown) by providing separation and isolation of the inner posts 228, the outer posts 254, and the jumper pads 250 thereby improving reliability.

Figure 3:
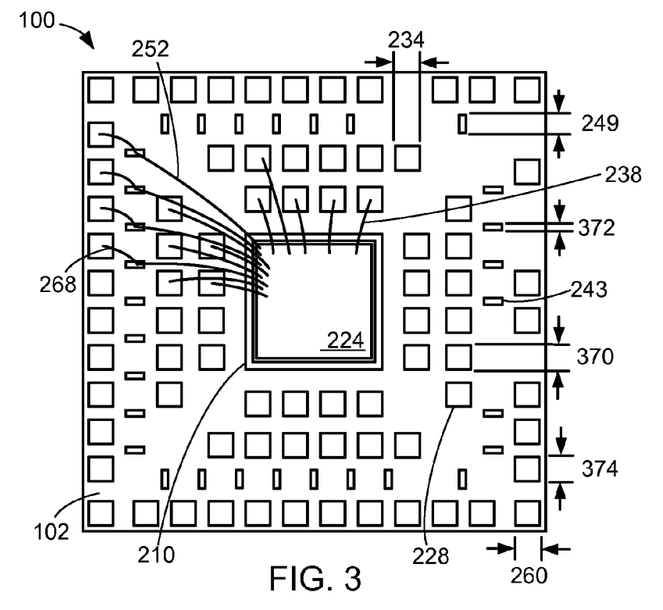
FIG. 3 is a top plan view of the integrated circuit packaging system without a portion of the encapsulation.

Referring now to FIG. 3, therein is shown a top plan view of the integrated circuit packaging system 100 without a portion of the encapsulation 102. The top plan view depicts the paddle 210 at an inner portion of the integrated circuit packaging system 100. For clarity, only a portion of the inner posts 228, the inner interconnects 238, the jumper pads 250, the first jumper interconnect 252, the outer posts 254, and the second jumper interconnect 268 are shown.

The inner posts 228 can surround the paddle 210. The inner posts 228 can have an inner post length 370. As an example, the inner post length 370 can be similar to the inner post width 234. The inner posts 228 can be connected to the integrated circuit 224 with the inner interconnect 238.

For illustrative purposes, the integrated circuit packaging system 100 is shown with the inner posts 228 arranged in a dual row array configuration, although it is understood that the inner posts 228 can be arranged differently. For example, the integrated circuit packaging system can have the inner posts 228 in a single row or triple row configuration. As a further example, the integrated circuit packaging system 100 can have the inner posts 228 in a staggered configuration.

The jumper pads 250 can have a jumper pad length 372. The jumper pad length 372 can be less than the inner post length 370. The jumper pad width 249 can be less than the inner pad width 234. As an example, the jumper pad width 249 can be greater than the jumper pad length 372.

The jumper pads 250 can be between the inner posts 228 and the outer posts 254. The jumper pads 250 can be connected to the integrated circuit 224 with the first jumper interconnect 252. The jumper pads 250 can be connected to the outer posts 254 with the second jumper interconnect 268. The jumper pads 250 can function as an intermediate connection point between the integrated circuit 224 and the outer posts 254.

For illustrative purposes, the integrated circuit packaging system is shown having the jumper pads 250 arranged in a row between the inner posts 228 and the outer posts 254, although it is understood that the jumper pads 250 can be arranged differently. For example, the integrated circuit packaging system 100 can have the jumper pads 250 selectively located to connect to the outer posts 254 in difficult locations, such as a corner location.

The outer posts 254 can be along the outer portion of the integrated circuit packaging system 100. The outer posts 254 have an outer post length 374. The outer post length 374 and the outer post width 260 can be similar to the inner post length 370 and the inner post width 234, respectively. The jumper post length 372 and the jumper pads 249 can be less than the outer post length 374 and the outer post width 260, respectively. As an example, the outer post width 260 can be similar to the outer post length 374.

It has been found that direct connection between the integrated circuit 224 and the outer posts 254 may require long and unstable connections that may short with other interconnects or collapse during molding of the encapsulation 102. Thus, direct connection between the outer posts 254 and the integrated circuit reduces reliability of the integrated circuit packaging system 100.

It has been discovered that the present invention provides an integrated circuit packaging system 100 with improved and connection and reliability. The jumper pads 250 connect between the integrated circuit 224 and the outer posts 254, providing an intermediate connection point. The jumper pads 250, the first jumper interconnect 252 and the second jumper interconnect 268 can improve connection and reliability by removing the need for long and unstable connection between the integrated circuit 224 and the outer posts 254 that can short with other connections.

Figure 4:
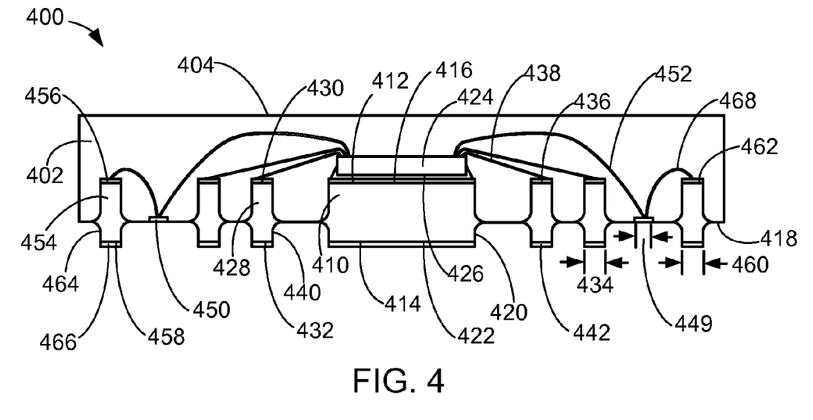
FIG. 4 is a cross-sectional view of an integrated circuit packaging system along line 2-2 of FIG. 1 in a second embodiment of the present invention.

Referring now to FIG. 4, therein is shown a cross-sectional view of an integrated circuit packaging system 400 along line 2-2 of FIG. 1 in a second embodiment of the present invention. The cross-sectional view depicts an encapsulation 402. The encapsulation 402 can have an encapsulation first side 404 and an encapsulation second side 418. The encapsulation first side 404 and the encapsulation second side 418 are horizontal.

The integrated circuit packaging system 400 can include a paddle 410, more specifically a die-attached paddle. The paddle 410 can have a paddle first side 412 and a paddle second side 414. The paddle first side 412 is entirely planar.

A contact layer 416, such as a coating or plating made out of materials including gold, silver, nickel-palladium alloy, or other alloys, can be over or on the paddle first side 412. The contact layer 416 functions as a wet-enhancing layer, an adhesion layer, or a combination thereof. The paddle 410 can include the contact layer 416.

The paddle 410 can be exposed from an encapsulation second side 418. The paddle 410 can include a paddle extension 420. The paddle extension 420 can extend from the encapsulation second side 418. The paddle second side 414 can be along the portion of the paddle extension 420 facing away from the encapsulation second side 418.

A paddle barrier 422, such as a coating or plating made from materials including gold, silver, nickel-palladium alloy, other alloys, or a material similar to the material used to form the contact layer 416, can be on the paddle second side 414. The paddle barrier 422 functions as an etch protection layer, an etch stop barrier, an adhesion layer, a wet-enhancing layer, or a combination thereof. The paddle barrier 422 can be optional.

An integrated circuit 424, such as an integrated circuit die or a flip chip, can be mounted over the paddle first side 412. The integrated circuit 424 can be over the contact layer 416. The integrated circuit 424 can be mounted with an adhesive 426, such as an adhesive paste or an adhesive film, between the integrated circuit 424 and the contact layer 416.

Inner posts 428, more specifically a conductive structure made from copper, a copper alloy, or a conductive alloy, can be adjacent to the paddle 410. The inner posts 428 can have an inner post first side 430 and an inner post second side 432. The inner post first side 430 can be co-planar with the paddle first side 412. The inner posts 428 can have an inner post width 434.

Inner contact pads 436, such as a coating or plating made from materials including gold, silver, nickel-palladium alloy, other alloys, or a material similar to the material used to form the contact layer 416, can be over the inner post first side 430. The inner contact pads 436 functions as a wet-enhancing layer, an adhesion layer, or a combination thereof. The inner post 428 can include the inner contact pads 436.

An inner interconnect 438, more specifically a bond wire or a ribbon bond wire, can connect the integrated circuit 424 and the inner posts 428. The inner interconnect 438 can be connected to the inner contact pads 436.

The inner posts 428 can have an inner post extension 440. The inner post extension 440 can be exposed and extend from the encapsulation second side 418. The inner post second side 432 can be along the portion of the inner post extension 440 facing away from the encapsulation second side 418.

Inner mounting pads 442, more specifically a coating or plating made from materials including gold, silver, nickel-palladium alloy, other alloys, or a material similar to the material used to form the contact layer 416, can be along the inner post second side 432. The inner mounting pads 442 function as an etch protection layer, an etch stop barrier, an adhesion layer, a wet-enhancing layer, or a combination thereof.

For illustrative purposes, the integrated circuit packaging system 100 is shown having two rows of the inner posts 428, although it is understood that the integrated circuit packaging system 100 can have a different number of the inner posts 428. For example, the integrated circuit packaging system 100 can have one of the inner posts 428 or three or more of the inner posts 428.

Jumper pads 450, more specifically a plate or pad made from materials including gold, silver, nickel-palladium alloy, other alloys, or a material similar to the material used to form the contact layer 416, adjacent to the inner post 428 on the side opposite from the paddle 410. The jumper pads 450 can be within and exposed from the encapsulation second side 418. The portion of the jumper pads 450 exposed from the encapsulation second side 418 can be co-planar with the encapsulation second side 418. The jumper pads 450 can have a jumper pad width 449. The jumper pad width 449 can be less than the inner post width 434.

A first jumper interconnect 452, more specifically a bond wire or a ribbon bond wire, can connect between integrated circuit 424 and the jumper contact pads 450. The first jumper interconnect 452 can be connected to the portion of the jumper pad 450 facing away from the encapsulation second side 418.

Outer posts 454, such as a conductive structure made from copper, a copper alloy, or a conductive alloy, can be adjacent to the jumper pads 450. The jumper pads 450 can be between the inner posts 428 and the outer posts 454. The outer posts 454 can have an outer post first side 456 and an outer post second side 458. The outer post first 456 can be co-planar with the paddle first side 412.

The outer posts 454 can have an outer post width 460. The outer post width 460 can be similar to the inner post width 434. The jumper post width 449 can be less than the outer post width 460.

Outer contact pads 462, such as a coating or plating made from materials including gold, silver, nickel-palladium alloy, other alloys, or a material similar to the material used to form the contact layer 416, can be over the outer post first side 456. The outer contact pads 462 function as a wet-enhancing layer, an adhesion layer, or a combination thereof. The outer posts 454 can include the outer contact pads 462.

The outer posts 454 can have an outer post extension 464. The outer post extension 464 can be exposed from and extend from the encapsulation second side 418. The outer post second side 458 can be along the portion of the outer post extension 464 facing away from the encapsulation second side 418.

Outer mounting pads 466, such as a coating made of a coating or plating made from materials including gold, silver, nickel-palladium alloy, other alloys, or a material similar to the material used to form the contact layer 416, can be on the outer post second side 458. The outer mounting pads 466 function as an etch protection layer, an etch stop barrier, an adhesion layer, a wet-enhancing layer, or a combination thereof.

A second jumper interconnect 468, more specifically a bond wire or ribbon bond wire, can connect between the jumper pads 450 and the outer posts 454. The second jumper interconnect 468 can be connected to the jumper pads 450 and the outer contact pads 462. The second jumper interconnects 468 can connect to the portion of the jumper pad 450 facing away from the encapsulation second side 418.

The encapsulation 402 can be around the paddle 410, the inner posts 428, the jumper pads 450, and the outer posts 454. The encapsulation 402 can cover the integrated circuit 424, the adhesive 426, the inner interconnect 438, the inner contact pads 436, the first jumper interconnect 452, the second jumper interconnect 468, and the outer contact pads 462.

Figure 5:
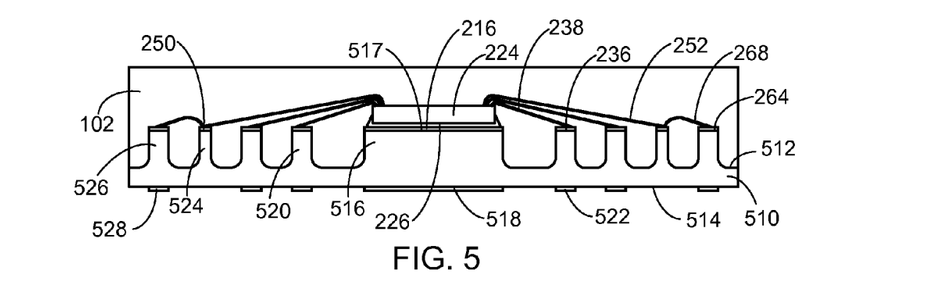
FIG. 5 is a cross-sectional view of a carrier in forming the encapsulation.

Referring now to FIG. 5, therein is shown a cross-sectional view of a carrier 510 in forming the encapsulation 102. As an example, the carrier 510 can be a structure made from copper, a copper alloy or a conductive alloy. The carrier 510 can have a carrier first side 512 and a carrier second side 514.

A mounting protrusion 516 can be over an inner portion of the carrier 510. The mounting protrusion 516 can extend from the carrier first side 512. The mounting protrusion 516 can have a mounting surface 517 on the portion of the mounting protrusion 516 facing away from the carrier first side 512. The mounting surface 517 can be entirely planar.

The contact layer 216 can be formed over mounting surface 517. The mounting protrusion can include the contact layer 216.

A mounting barrier pad 518, such as a coating or plating made from materials including gold, silver, nickel-palladium alloys or other alloys, can be on the portion of the carrier second side 514 below the mounting protrusion. The mounting barrier pad 518 functions as an etch stop barrier or an etch protection layer.

Inner protrusions 520 can be over the carrier 510. The inner protrusions 520 can extend from the carrier first side 512. The mounting surface 517 can be co-planar with the portion of the inner protrusion 520 facing away from the carrier first side 512. The inner protrusions 520 can be adjacent to the mounting protrusion 516.

The inner contact pads 236 can be formed over the portion of the inner protrusions 520 facing away from the carrier first side 512. The inner protrusions 520 can include the inner contact pads 236.

For illustrative purposes, the carrier 510 is shown having two of the inner protrusions 520, although it is understood that the carrier 510 can have a different number of the inner protrusions 520. For example, the carrier 510 can have one of the inner protrusions 520 or three or more of the inner protrusions 520.

Inner barrier pads 522, such as a coating or plating made from materials including gold, silver, nickel-palladium alloys, other alloys or a material similar to the material used to form the mounting barrier pad 518, can be on the portion of the carrier second side 514 below the inner protrusions 520. The inner barrier pads 522 function as an etch stop barrier or an etch protection layer.

Jumper protrusions 524 can be over the carrier 510. The jumper protrusions 524 can extend from the carrier first side 512. The mounting surface 517 can be co-planar with the portion of the jumper protrusion 524 facing away from the carrier first side 512. The jumper protrusions 524 can be adjacent to the inner protrusions 520 on the side opposite from the mounting protrusion 516. The jumper pads 250 can be formed over the portion of the jumper protrusions 524 facing away from the carrier first side 512.

Outer protrusions 526 can be over an outer portion of the carrier 510. The outer protrusions 526 can extend from the carrier first side 512. The mounting surface 517 can be co-planar with the portion of the outer protrusion 526 facing away from the carrier first side 512. The outer contact pads 262 can be over the portion of the outer protrusions 526 that is facing away from the carrier first side 512. The jumper protrusions 524 can be between the inner protrusions 520 and the outer protrusions 526.

Outer barrier pads 528, such as a coating or plating made from materials including gold, silver, nickel-palladium alloys, other alloys or a material similar to the material used to form the mounting barrier pad 518, can be on the portion of the carrier second side 514 below the outer protrusions 526. The outer barrier pads 528 function as an etch stop barrier or an etch protection layer.

The integrated circuit 224 can be mounted over the mounting surface 517 of the mounting protrusion 516. The integrated circuit 224 can be over the contact layer 216 with the adhesive 226 in between.

The inner interconnect 238 can be connected between the integrated circuit 224 and the inner protrusions 520. The inner interconnect 238 can be connected to the inner contact pads 236.

The first jumper interconnect 252 can be connected between the integrated circuit 224 and the jumper protrusions 524. The first jumper interconnect 25 can be connected to the jumper pads 250.

The second jumper interconnect 268 can be connected between the jumper protrusions 524 and the outer protrusions 526. The second jumper interconnect 268 can be connected to the jumper pads 250 and the outer contact pads 262.

The encapsulation 102 can be formed over the carrier 510. The encapsulation 102 can be over the carrier first side 512 and can cover the mounting protrusion 516, the inner protrusions 520, the jumper protrusions 524, the outer protrusions 526, the integrated circuit 224, the adhesive 226, the inner interconnect 228, the first jumper interconnect 252, and the second jumper interconnect 268.

Figure 6:
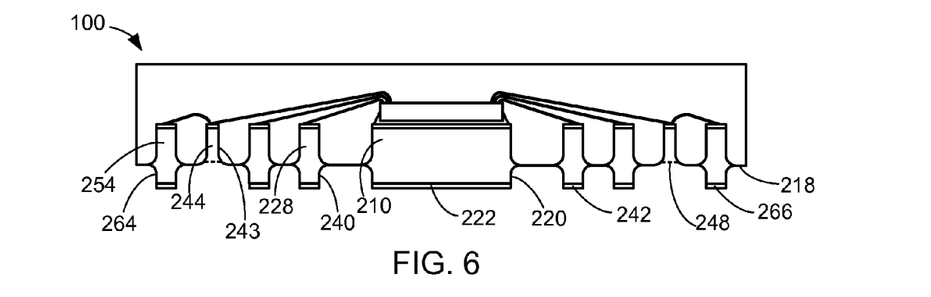
FIG. 6 is the structure of FIG. 5 in forming the integrated circuit packaging system of FIG. 1.

Referring now to FIG. 6, therein is shown the structure of FIG. 5 in forming the integrated circuit packaging system 100 of FIG. 1. Portions of the carrier 510 of FIG. 5 can be removed to expose the encapsulation second side 218.

The portion of the carrier 510 between the inner protrusions 520 of FIG. 5 and the mounting protrusion 516 of FIG. 5 can be removed to form the paddle 210, the paddle extension 220 and the paddle barrier 222. The portion of the carrier 510 between the inner protrusion 520 of FIG. 5 and the outer protrusion 526 of FIG. 5 can be removed to form the inner posts 228, the inner post extension 240, and the inner mounting pads 242. The portion of the carrier 510 adjacent to the side of the outer protrusions 526 opposite of the jumper protrusions 524 can form the outer posts 254, the outer post extension 264, and the outer mounting pads 266.

The jumper protrusion 524 of FIG. 5 and the portion of the carrier 510 below the jumper protrusions 524 can be removed to form the encapsulation cavity 243 and expose a portion of the jumper pads 250. Optionally, the portion of the carrier 510 below the jumper protrusions 524 and between the inner protrusion 520 and the outer protrusion 526 can be removed to form the jumper posts 244 and expose the jumper post second side 248 from the encapsulation second side 218.

The portions of the carrier 510 can be removed to form the integrated circuit packaging system 100. The portions of the carrier 510 can be removed by a number of different methods. For example, the portions of the carrier 510 can be removed by mechanical processes such as grinding or chemical processes such as etching.

Figure 7:
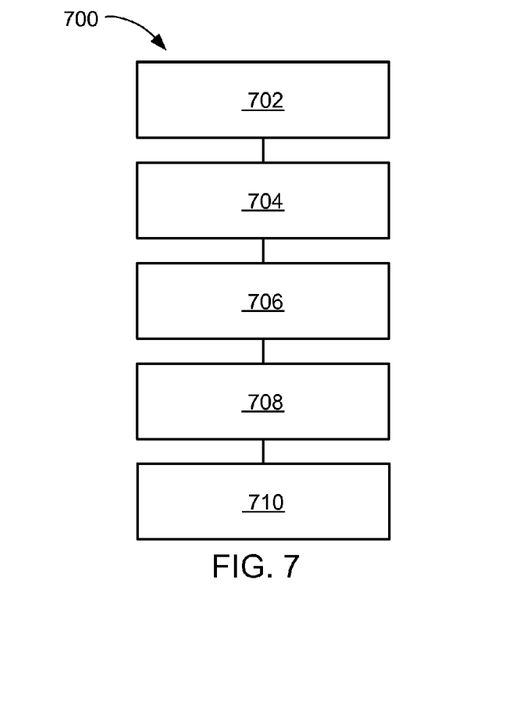
FIG. 7 is a flow chart of a method of manufacture of the integrated circuit packaging system in a further embodiment of the present invention.

Referring now to FIG. 7, therein is shown a flow chart of a method 700 of manufacture of the integrated circuit packaging system in a further embodiment of the present invention. The method 700 includes: forming a paddle, an inner post adjacent to the paddle, a jumper pad, and an outer post, with the jumper pad between the inner post and the outer post in a block 702; mounting an integrated circuit over a paddle first side, the paddle first side co-planar with the outer post in a block 704; connecting a first jumper interconnect between the integrated circuit and the jumper pad in a block 706; connecting a second jumper interconnect between the jumper pad and the outer post in a block 708; and forming an encapsulation over paddle, the integrated circuit, the first jumper interconnect, the jumper pad, and the second jumper interconnect in a block 710.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming a paddle, an inner post adjacent to the paddle, a jumper pad, and an outer post, with the jumper pad between the inner post and the outer post;
    mounting an integrated circuit over a paddle first side, the paddle first side co-planar with the outer post;
    connecting a first jumper interconnect between the integrated circuit and the jumper pad;
    connecting a second jumper interconnect between the jumper pad and the outer post; and
    forming an encapsulation over paddle, the integrated circuit, the first jumper interconnect, the jumper pad, and the second jumper interconnect, the encapsulation co-planar with the jumper pad.

2. The method as claimed in claim 1 wherein forming the jumper pad includes forming the jumper pad co-planar with the paddle first side.

3. The method as claimed in claim 1 further comprising:
    forming a jumper post between the inner post and the outer post with a jumper post second side exposed and recessed from the encapsulation; and
wherein:
    forming the jumper pad includes forming the jumper pad on a jumper post first side within the encapsulation.

4. The method as claimed in claim 1 wherein forming the paddle, the inner post, and the outer post includes forming a paddle extension, an inner post extension, and an outer post extension, respectively, with the paddle extension, the inner extension, and the outer extension exposed from and extending from the encapsulation.

5. A method of manufacture of an integrated circuit packaging system comprising:
    forming a paddle having a paddle extension, an inner post adjacent to the paddle, the inner post having an inner post extension, a jumper pad, and an outer post having an outer post extension, with the jumper pad between the inner post and the outer post;
    mounting an integrated circuit over a paddle first side co-planar with the outer post;
    connecting an inner interconnect between the integrated circuit and the inner post;
    connecting a first jumper interconnect between the integrated circuit and the jumper pad;
    connecting a second jumper interconnect between the jumper pad and the outer post;
    forming an encapsulation over paddle, the integrated circuit, the inner interconnect, the first jumper interconnect, the jumper pad, and the second jumper interconnect, with the paddle extension, the inner post extension, and the outer post extension exposed and extending from the encapsulation; and
    forming an encapsulation cavity in the encapsulation between the inner post and the outer post, and exposing the jumper pad from within the encapsulation cavity.

6. The method as claimed in claim 5 further comprising:
    forming an inner contact pad on the inner post; and
wherein:
    connecting the inner interconnect between the integrated circuit and the inner post includes connecting the inner interconnect to the inner contact pad.

7. The method as claimed in claim 5 further comprising:
    forming an outer contact pad on the outer post; and
wherein:
    connecting the second jumper interconnect between the jumper pad and the outer post includes connecting the second jumper interconnect to the outer contact pad.

8. The method as claimed in claim 5 wherein forming the paddle extension, the inner post extension, and the outer post extension includes forming a barrier pad, an inner mounting pad, and an outer mounting pad on the portion of the paddle extension, the inner post extension, and the outer post extension facing away from the encapsulation, respectively.

9. An integrated circuit packaging system comprising:
    a paddle having a paddle first side and the paddle second side;
    an integrated circuit mounted over the paddle first side;
    an inner post adjacent to the paddle;
    a jumper pad adjacent to the inner post on a side opposite the paddle;
    an outer post adjacent to the jumper pad, with the jumper pad between the inner post and the outer post;
    a first jumper interconnect connected between the integrated circuit and the jumper pad;
    a second jumper interconnect connected between the jumper pad and the outer post; and
    an encapsulation over the paddle, the integrated circuit, the jumper pad, and the outer post, and wherein the jumper pad is within and exposed from the encapsulation with the exposed portion of the jumper pad co-planar with the encapsulation.

10. The system as claimed in claim 9 wherein the jumper pad is co-planar with the paddle first side.

11. The system as claimed in claim 9 further comprising:
    a jumper post between the inner post and the outer post with a jumper post second side exposed and recessed from the encapsulation; and
wherein:
    the jumper pad is on a jumper post first side.

12. The system as claimed in claim 9 wherein:
    the paddle includes a paddle extension, the paddle extension exposed and extending from the encapsulation;
    the inner post includes an inner post extension, the inner post extension exposed and extending from the encapsulation; and the outer post includes an outer post extension, the outer post extension exposed and extending from the encapsulation.

13. The system as claimed in claim 9 further comprising:
an inner interconnect connected between the integrated circuit and the inner post; and
wherein:
the paddle includes a paddle extension, the paddle extension exposed and extending from the encapsulation;
the inner post includes an inner post extension, the inner post extension exposed and extending from the encapsulation; and
the outer post includes an outer post extension, the outer post extension exposed and extending from the encapsulation.

14. The system as claimed in claim 13 further comprising:
an inner contact pad on the inner post; and
wherein:
the inner interconnect is connected to the inner contact pad.

15. The system as claimed in claim 13 further comprising:
an outer contact pad on the outer post; and
wherein:
the second jumper interconnect is connected to the outer contact pad.

16. The system as claimed in claim 13 further comprising:
a paddle barrier on the portion of the paddle extension facing away from the encapsulation;
an inner mounting pad on the portion of the inner post extension facing away from the encapsulation; and
an outer mounting pad on the portion of the outer post extension facing away from the encapsulation.

17. The system as claimed in claim 13 wherein:
the encapsulation includes an encapsulation cavity between the inner post and the outer post; and
the jumper pad is exposed from within the encapsulation cavity.

* * * * *